United States Patent
Marathe

(10) Patent No.: US 6,498,384 B1
(45) Date of Patent: Dec. 24, 2002

(54) STRUCTURE AND METHOD OF SEMICONDUCTOR VIA TESTING

(75) Inventor: Amit P. Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/730,984

(22) Filed: Dec. 5, 2000

(51) Int. Cl.[7] .................. H01L 27/148; H01L 23/52; H01L 23/58
(52) U.S. Cl. .................. 257/520; 257/751; 257/758; 257/760; 257/774; 257/211; 257/920
(58) Field of Search ................ 257/758, 751, 257/774, 760, 211, 520, 920

(56) References Cited

U.S. PATENT DOCUMENTS

| | | | | |
|---|---|---|---|---|
| 5,962,341 A | * | 10/1999 | Ito | 438/692 |
| 6,107,185 A | * | 8/2000 | Lukanc | 438/631 |
| 6,211,569 B1 | * | 4/2001 | Lou | 257/758 |
| 6,221,780 B1 | * | 4/2001 | Greco et al. | 438/702 |
| 6,316,833 B1 | * | 11/2001 | Oda | 257/758 |

\* cited by examiner

Primary Examiner—Eddie Lee
Assistant Examiner—Joseph Nguyen
(74) Attorney, Agent, or Firm—Mikio Ishimaru

(57) ABSTRACT

A semiconductor wafer having a via test structure is provided which includes a semiconductor substrate having a plurality of semiconductor devices. A dielectric layer deposited over the semiconductor substrate has second and fourth channels unconnected to the plurality of semiconductor devices. A via dielectric layer deposited over the channel dielectric layer has first and second vias and third and fourth vias respectively open to opposite ends of the second channel and the fourth channel. A second dielectric layer over the via dielectric layer has first, third, and fifth channels respectively connected to the first via, the second and third vias, and the fourth via. The first channel, the first via, the second channel, the second via, the third channel, the third via, the fourth channel, the fourth via, and the fifth channel are connected in series and the first and fifth channel are probed to determine the presence or absence of voids in the vias.

8 Claims, 2 Drawing Sheets

STRUCTURE AND METHOD OF SEMICONDUCTOR VIA TESTING

TECHNICAL FIELD

The present invention relates generally to semiconductors and more specifically to a testing method for semiconductor wafers.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings. The seed layer, generally of copper, is deposited to act as an electrode for the electroplating process.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "cap" layer and a "single" damascene process is completed. When the layer is processed further for placement of additional channels over it, the layer is a via stop layer.

The via formation step of the dual damascene process begins with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide ($SiO_x$), the via stop layer is a nitride, such as silicon nitride (SiN), so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, which are deposited by electroplating, a seed layer is deposited by an electroless deposition process such as physical vapor deposition (PVD) or ionized metal plasma (IMP) deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "cap" layer and the "dual" damascene process is completed.

The layer may be processed further for placement of additional levels of channels and vias over it.

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

As the size of semiconductor device is decreased in order to increase speed and reduce cost, the vias shrink in size and increase in aspect ratio, the depth to width ratio. As the vias become smaller and narrower, it becomes more difficult to assure proper formation of the vias without voids. Since a single via with a void can result in the failure of an entire integrated circuit, it is highly desirable to be able to test the vias for the absence of voids.

Currently, step coverage and physical continuity are measured by taking transmission electron microscope (TEM) measurements of the cross-sections of the channels in a semiconductor device. This requires the destruction of the semiconductor device in order to make the measurement.

Another method involves the use of test structures having two vias which are connected at the bottoms and tested across the tops of the vias. These test structures are neither sensitive nor reliable for physical continuity testing.

Solutions for nondestructively testing and physical continuity testing have been long sought by, but have eluded, those skilled in the art. Further, it would be desirable to measure electrical continuity, but there are no currently existing solutions to meet this desire.

DISCLOSURE OF THE INVENTION

The present invention provides a semiconductor wafer having a via test structure which includes a semiconductor substrate having a plurality of semiconductor devices. A dielectric layer deposited over the semiconductor substrate has second and fourth channels unconnected to the plurality of semiconductor devices. A via dielectric layer deposited over the channel dielectric layer has first and second vias and third and fourth vias respectively open to opposite ends of the second channel and the fourth channel. A second dielectric layer over the via dielectric layer has first, third, and fifth channels respectively connected to the first via, the second and third vias, and the fourth via. The first channel, the first via, the second channel, the second via, the third channel, the third via, the fourth channel, the fourth via, and the fifth channel are connected in series and the first and fifth channel are probed to determine the presence or absence of voids in the vias.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
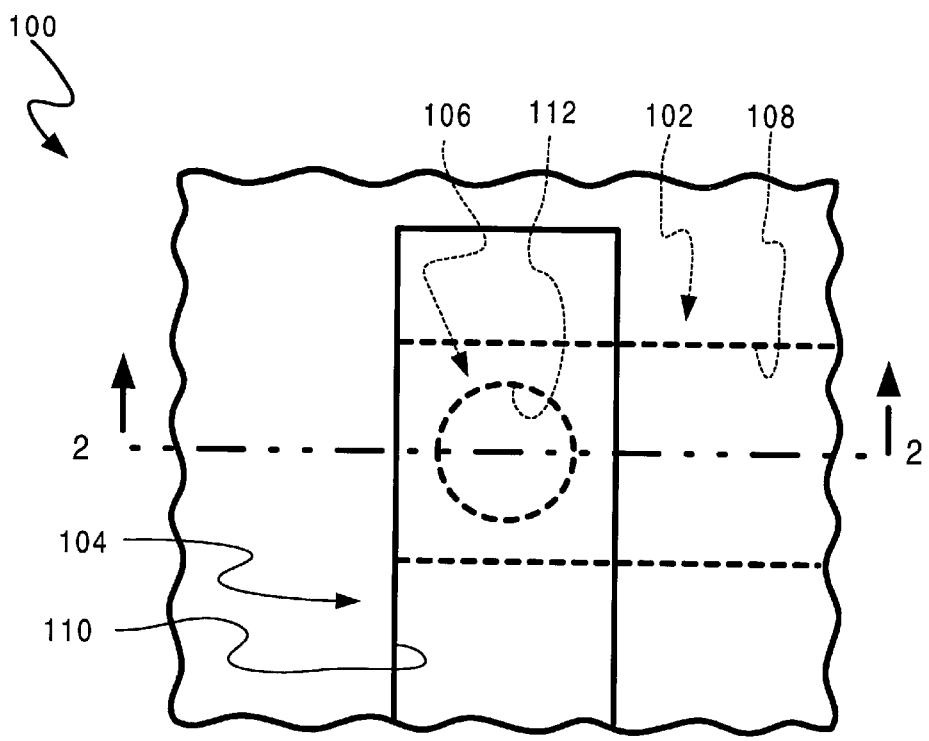
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side"(as in "sidewall"), "higher", "lower", "over", and "under", are defined with respect to the horizontal plane.

Figure 2:
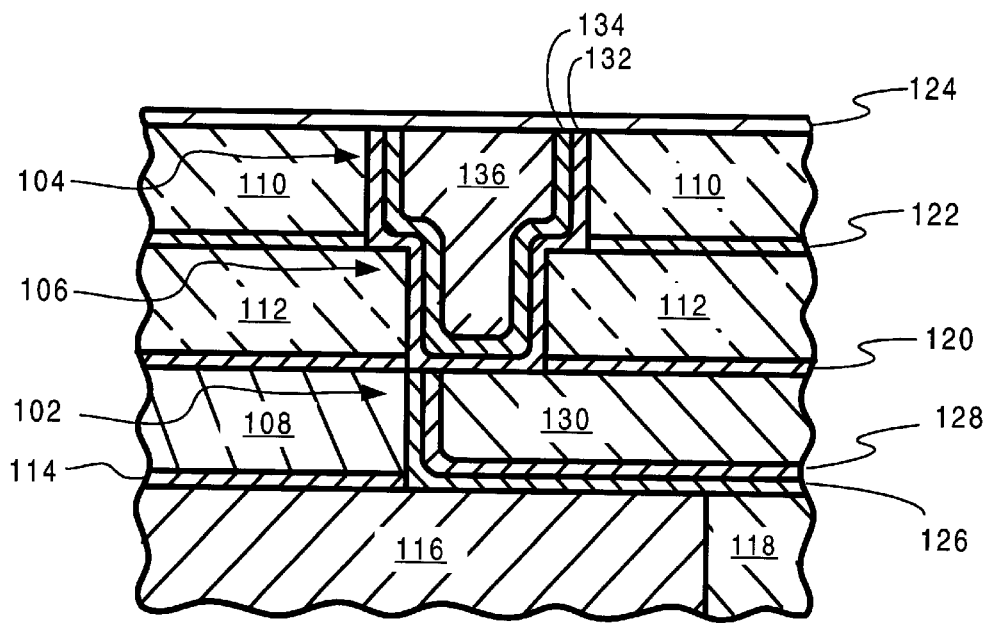
FIG. 2 (PRIOR ART) is a cross-section of FIG. 1 along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

The deposition of the barrier layer 132 is such that it fills the bottom of the via 106 at barrier layer portion 138 so as to effectively separate the conductor cores 130 and 136.

In the past, for copper conductor material and seed layers, highly resistive diffusion barrier materials such as tantalum nitride (TaN), titanium nitride (TiN), or tungsten nitride (WN) were used as barrier materials to prevent diffusion.

Figure 3:
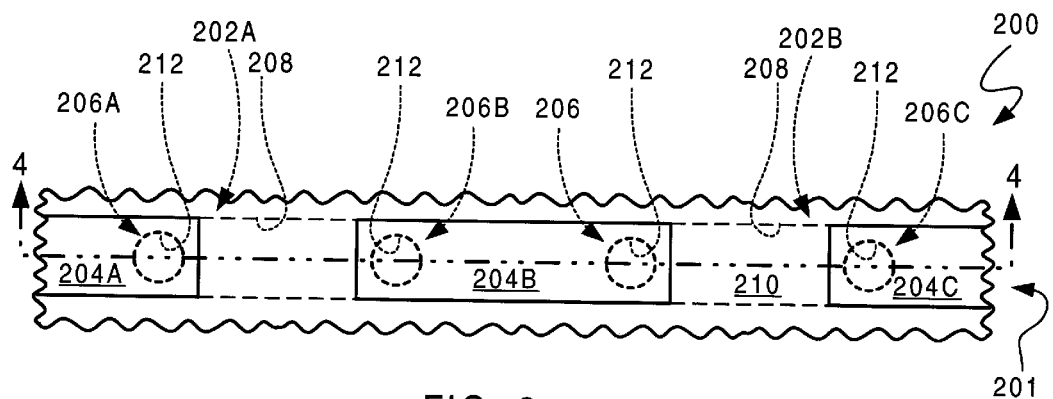
FIG. 3 is a plan-view of the test structure of the present invention.

Referring now to FIG. 3, therein is shown a plan view of a semiconductor wafer 200 with a silicon semiconductor substrate (not shown) having a via test structure 201 of in-line channels interconnected by vias. A cappling layer is shown removed to simplify the figure. A first channel 204A is connected at one end by a via 206A to one end of a second channel 202A. The opposite end of the second channel 202A is connected by a via 206B to one end of a third channel 204B. The far end of the third channel 204B is connected by a via 206C to one end of a fourth channel 202B. The far end of the fourth channel 202B is connected by a via 206D to a fifth channel 204C. The second and third channels 202A and 204B are disposed in a first channel dielectric layer 208. The first, third, and fifth channels 204A, 204B, and 204C, respectively, are disposed in a second channel dielectric layer 210. Vias 206A, 206B, 206C, and 206D are also in-line and disposed in a via dielectric layer 212.

Figure 4:
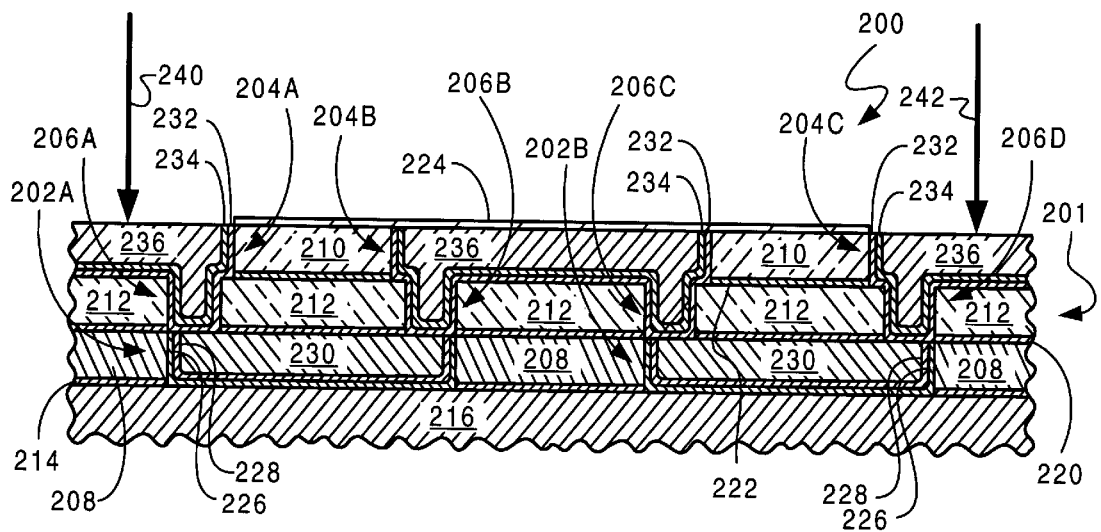
FIG. 4 is a cross-section of FIG. 3 along line 3—3.

Referring now to FIG. 4, therein is shown a cross-section of FIG. 3 along line 4—4. The via test structure 201 on the semiconductor wafer 200 is shown as deposited on a device dielectric layer 216 during the deposition of a conventional interconnect structure for an integrated circuit chip.

Essentially, the device dielectric layer 216 has a stop layer 214 and the first channel dielectric 208 deposited on thereon. The first channel dielectric layer 208 and the stop layer 214 are photolithographically processed and etched to form openings for the second and fourth channels 202A and 202B. Subsequently, a barrier layer 226, a seed layer 228, and a conductor core 230 are deposited. A chemical-mechanical polishing (CMP) process is used to planarize the conductor core 230, the seed layer 228, and the barrier layer 226 to be coplanar with the first channel dielectric 208 and to form the second and fourth channels 202A and 202B.

Subsequently, a via stop layer 220 and a via dielectric layer 212 are deposited over the first channel dielectric 208 and the second and fourth channels 202A and 202B. The via stop layer 220 is photolithographically processed and etched for via openings, but the via dielectric layer 212 is not.

A second channel stop layer 222 is then deposited over the via dielectric layer 212 followed by the deposition of a second channel dielectric layer 210. The second channel dielectric layer 210 and the second channel stop layer 222 are photolithographically processed for the simultaneous formation of the second level of channels and the vias.

The barrier layer 232, the seed layer 234, and the conductor core 236 are sequentially deposited and subject to CMP to become coplanar with the top surface of the second channel dielectric 210 and to simultaneously form the first, third, and fifth channels 204A, 204B, and 204C, respectively, and the first, second, third, and fourth vias 206A, 206B, 206C, and 206D, respectively.

Subsequently, a capping layer 224 is deposited over the second channel dielectric layer 210 and the first, third, and fifth channels 204A, 204B, and 204C, respectively. The capping layer 224 is then covered with photoresist, patterned, developed, and etched to expose the first and fifth channels 204A and 204C.

It will be noted that the same vias and channels as used for the semiconductor device connected portions of the integrated circuit are formed in the above processes.

By placing probes 240 and 242 of a testing meter into contact with the exposed portions of the first and fifth channels 204A and 204C, various electrical measurements may be made. A calibration measurement is first made of the resistance of the via test structure 201 of the semiconductor wafer 200 having completely filled vias with no voids as determined by TEM measurements; i.e., a reference measurement of "standard" vias. Subsequently, production semiconductor wafers need only be probed and resistance measurements taken, nondestructively, and compared to this reference resistance measurement to determine the existence of voids.

As would be evident to those skilled in the art, the via test structure 201 becomes more sensitive to detect voids caused by the process as the chain becomes longer with more channels and vias. The long series of channels and vias can capture the voiding statistically since the probability of one or more of the vias having a void is high in a process which may be subject to voiding. A void in any one of the plurality of vias may be sensed.

A package level electromigration (EM) test or a fast wafer level reliability (WLR) isothermal test can be used to detect the voids. Further, a good process can serve as the baseline for comparison of test results on "non-optimized" processes.

The via test structure 201 can also be used as a WLR test monitor in the fabrication facility during the manufacturing phase to periodically monitor the fabrication process.

While only four vias are shown in the Best Mode, it would be evident that the sensitivity increases with the number of vias being tested. Further, while the channels are shown in-line, it would be evident that the primary criterion is that the vias be connected in series.

It would be understood by those skilled in the art that the present invention is particularly useful with copper conduction via since tungsten and aluminum conductor vias have high resistances which make test measurements difficult.

In the best mode, the barrier layers are of materials such as tantalum (Ta), titanium (Ti), tungsten (W), nitrides thereof, and a combination thereof. The seed layers and/or conductor cores are of materials such as copper (Cu), copper-base alloys, aluminum (Al), aluminum-base alloys, gold (Au), gold-base alloys, silver (Ag), silver-base alloys, and a combination thereof. The dielectric layers are of silicon dioxide or a low dielectric material such as HSQ, Flare, etc. The stop layers are of materials such as silicon nitride or silicon oxynitride.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters set forth herein or shown in the accompanying drawings are to be interpreted in an illustrative and non-limiting sense.

The invention Claimed is:

1. A semiconductor wafer having a via test structure comprising:

a semiconductor substrate having a plurality of semiconductor devices;

a first dielectric layer over the semiconductor substrate having a plurality of openings provided therein;

first barrier layers lining the openings;

first conductor cores filling the openings to form second and fourth channels unconnected to the plurality of semiconductor devices;

a via dielectric layer formed over the dielectric layer and having first and second via openings and third and fourth via openings provided therein respectively open to opposite ends of the second channel and the fourth channel;

a second dielectric layer formed over the via dielectric layer and having first, third, and fifth channel openings provided therein respectively open to the first via opening, the second and third via openings, and the fourth via opening;

second barrier layers lining the first, second, third, and fourth via openings and the first, third, and fifth channel openings; and second conductor cores filling the first, second, third, and fourth via openings and the first, third and fifth channel openings to form first, third, and fifth channels having the first channel, the first via, the second channel, the second via, the third channel, the third via, the fourth channel, the fourth via, and the fifth channel connected in series whereby the first and fifth channels are probed to determine the presence or absence of voids in the vias.

2. The semiconductor wafer as claimed in claim 1 including a capping layer over the second dielectric layer and the first, third, and fifth channel opening whereby the first and fifth channel are exposed to be probed.

3. The semiconductor wafer as claimed in claim 1 wherein the first, second, third, and fourth channels are in-line.

4. The semiconductor wafer as claimed in claim 1 wherein the first and second conductor cores are of a material selected from a group consisting of copper, aluminum, silver, gold, alloys thereof, and combinations thereof.

5. A semiconductor wafer having a via test structure comprising. a silicon substrate having a plurality of semiconductor deices;

a device oxide layer on the semiconductor substrate;

a first oxide layer on the device dielectric and having a plurality of openings provided therein;

first barrier layers lining the plurality of openings;

first seed layers lining the first barrier layers;

first conductor cores filling the openings to form second and fourth channels unconnected to the plurality of semiconductor devices;

a via oxide layer formed over the channel dielectric layer and having first and second via op and third and fourth via openings provided therein respectively open to opposite ends of the second channel and the fourth channel;

a second oxide layer formed over the via dielectric layer and having first, third, and fifth channel openings provided therein respectively open to the first via opening, the second and third via openings, and the fourth via opening;

second barrier layers lining the first, second, third and fourth via openings and the first, third, and fifth channel openings;

second seed layers lining the second barrier layers; and second conductor cores filling the first, second, third, and fourth via opt and the first, third, and fifth channel opening to form first, third, and fifth channels having the first channel, the first via, the second channel, the second via, the third channel, the third via, the fourth channel, the fourth via, and the fifth channel connected in series whereby the first and fifth channels are probed to determine the presence or absence of voids in the fist, second, third, and fourth vias.

6. The semiconductor wafer as claimed in claim 5 including a capping layer over the second dielectric layer and the first, third, and fifth channel opening whereby the first and fifth channel are exposed to be probed.

7. The semiconductor wafer as claimed in claim 5 wherein the first, second, third, fourth, and fifth channels are in-line and the first, second, third, and fourth vias are in-line.

8. The semiconductor wafer as claimed in claim 5 wherein the seed layers and the first and second. conductor cores are of a material selected from a group consisting of copper, aluminum, silver, gold, alloys thereof, and combinations thereof.

* * * * *

UNITED STATES PATENT AND TRADEMARK OFFICE
CERTIFICATE OF CORRECTION

PATENT NO.   : 6,498,384 B1
DATED        : December 24, 2002
INVENTOR(S)  : Marathe It is certified that error appears in the above-identified patent and that said Letters Patent is hereby corrected as shown below:

<u>Title page,</u>
Item [54], delete "STRUCTURE AND METHOD OF"

<u>Column 7,</u>
Line 18, delete "deices:" and insert therefore -- devices: --
Line 29, delete "op" and insert therefor -- openings --

<u>Column 8,</u>
Line 11, delete "opt" and insert therefore -- openings --
Line 12, delete "opening" and insert therefore -- openings --

Signed and Sealed this

Thirteenth Day of May, 2003

JAMES E. ROGAN
*Director of the United States Patent and Trademark Office*